United States Patent [19]

Berry

[11] Patent Number: 4,857,097
[45] Date of Patent: Aug. 15, 1989

[54] METHOD AND APPARATUS FOR COATING GLASS

[75] Inventor: Ronald F. Berry, Wigan, United Kingdom

[73] Assignee: Pilkington plc, St. Helens, England

[21] Appl. No.: 137,077

[22] Filed: Dec. 23, 1987

[30] Foreign Application Priority Data

Aug. 28, 1987 [GB] United Kingdom ............... 8720360

[51] Int. Cl.[4] .......................................... C03C 25/02
[52] U.S. Cl. ................... 65/60.52; 65/60.7; 65/60.8; 65/99.2; 65/182.3; 118/718; 427/252; 427/255.5
[58] Field of Search ............. 65/60.4, 60.5, 60.52, 65/60.8, 60.7, 99.2, 99.4, 182.3; 118/718; 427/110, 252, 255.5

[56] References Cited

U.S. PATENT DOCUMENTS

| | | | |
|---|---|---|---|
| 3,689,304 | 9/1972 | Bamford | 65/60.52 X |
| 3,887,349 | 6/1975 | Akashi et al. | 65/60.52 X |
| 4,019,887 | 4/1977 | Kirkbride et al. | 65/60.8 |
| 4,123,244 | 10/1978 | Leclercq et al. | 65/60.7 X |
| 4,349,372 | 9/1982 | Laethem et al. | 65/60.4 |
| 4,469,045 | 9/1984 | Chesworth | 65/60.52 X |

Primary Examiner—Robert L. Lindsay
Attorney, Agent, or Firm—Burns, Doane, Swecker & Mathis

[57] ABSTRACT

A stream of inert gas is induced to flow over the surface, adjacent the glass, of diverting means used to divert a flow of used coating gas away from a glass surface being coated. The stream of inert gas avoids build-up of deposits from the used coating gas on the said surface of the diverting means.

17 Claims, 4 Drawing Sheets

METHOD AND APPARATUS FOR COATING GLASS

BACKGROUND OF THE INVENTION

1. Field of the Invention

The invention relates to the coating of flat glass and in particular to a method of coating flat glass by deposition of a coating from a coating gas and to an apparatus suitable for use in operating the method.

2. Description of the Prior Art

It is known to coat flat glass by chemical vapour deposition, and U.S. Pat. 4,469,045 describes a method and apparatus in which a coating gas is directed on to the surface of a hot ribbon of glass to be coated from a distributor extending across that surface transverse to the direction of movement of the ribbon, so that the gas flows substantially parallel to the glass under laminar flow conditions and uniformly across the width of the surface. A coating is deposited on the hot glass surface and the used coating gas is directed upwardly away from the glass surface along an exhaust channel formed between upstream and downstream guide walls. An extractor duct is provided in the region of the upper end of the exhaust channel, but is not connected to the exhaust channel.

When the method and apparatus described in U.S. Pat. No. 4,469,045 is used for the deposition of a reflecting silicon coating on a ribbon of hot glass, it is found that, after a period of operation, a silicon containing deposit builds up on the undersurface of the downstream toe, that is, the surface, adjacent the glass, of a guide member which limits the coating zone at its downstream end and diverts used gas away from the glass. This deposit eventually touches the glass and damages the coating formed on the glass, and the coating process has to be interrupted while the apparatus is removed from over the glass and cleaned to remove the deposit.

BRIEF SUMMARY OF THE INVENTION

It has been found that build-up of the deposit can be reduced or substantially avoided, and satisfactory coating maintained over significantly longer periods, by passing a stream of inert gas over the said surface adjacent the glass.

According to the present invention, there is provided a method of coating flat glass by chemical vapour deposition comprising passing a coating gas over a hot glass surface in a coating zone, directing used gas away from the glass at the downstream end of the coating zone by diverting means including a surface adjacent the glass surface and passing a stream of inert gas over said surface of the diverting means to inhibit formation of a deposit from the used gas on said surface.

The expression 'inert gas' is used herein to refer to a gas which does not itself deposit a coating on the glass and does not undergo any reaction detrimental to the coating process with the used coating gas. The stream of inert gas may be composed of the atmosphere surrounding the coating station at which the coating is applied. When the coating is applied to a ribbon of float glass as it is advanced over the float bath, the stream of inert gas used may conveniently be composed of the protective atmosphere of the float bath.

Preferably the used gas is directed away from the glass along an exhaust channel and a flow of inert gas over said surface of the diverting means and along the exhaust channel is induced by suction applied to the exhaust channel.

The diverting means may include a surface defining the downstream wall of the exhaust channel which is continuous with said surface adjacent the glass. The diverting means is preferably shaped for smooth flow of the inert gas over said surfaces of the diverting means without mixing of the inert gas and the used coating gas.

The method of the invention is useful for coating flat glass by chemical vapour deposition. The expression "chemical vapour deposition" is used herein to refer to processes in which the coating is formed by reaction of one or more gas phase sources. For example, the coating gas may be a gas, such as a metal carbonyl, which pyrolyses to deposit a coating on the glass, or a mixture of gases which react together, for example stannic chloride vapour and water vapour, to deposit a coating on the glass. The coating gas may contain a non-reactive component, for example nitrogen, as a carrier.

The method may be used, for example, in alleviating or avoiding the problems resulting from silicon-containing deposits formed when using a silane-containing gas to apply a coating to hot glass. Silane containing gases may be used to deposit a reflecting silicon coating as described in U.S. Pat. Nos. 4,469,045 and 4,019,887, or a coating containing silicon and oxygen and having a high light transmission, useful as a barrier coating to prevent migration of alkali metal ions from the glass, as described in published UK specification GB No. 2 163 146A.

According to a further aspect of the invention, there is provided, in an apparatus for coating flat glass by deposition of a coating from a coating gas comprising a support for the glass to be coated, means for advancing the glass over said support, a gas supply duct extending transversely of the path of travel of the glass arranged to direct a coating gas onto the hot glass surface in a coating zone, diverting means including a surface adjacent the glass surface for diverting used gas away from the glass at the downstream end of the coating zone, an exhaust channel for flow of used coating gas away from the glass surface, and suction means for collecting used gas from the exhaust channel the improvement comprising the suction means being connected to the exhaust channel and the said surface of the diverting means being spaced from the path of travel of glass for induction of a stream of inert gas over said surface by operation of the suction means.

The diverting means preferably includes a surface defining the downstream wall of the exhaust channel continuous with said surface adjacent the glass and shaped for smooth flow of said inert gas thereover without mixing of the inert gas and the used coating gas.

The surface adjacent the glass is preferably parallel to and spaced at least 5 mm from the path of travel of the surface of the glass. This facilitates a flow of outside atmosphere between the glass surface and said surface, the atmosphere serving as the inert gas flowing over said surface and inhibiting the formation of a deposit from the used coating gas on said surface.

In a preferred embodiment of the invention, the apparatus comprises a centre block and first and second side members disposed adjacent said centre block defining a substantially U-shaped guide channel for gas from the gas supply duct between the first side member and the upstream side wall of the centre block, between the bottom wall of the centre block and the path of the glass, and between the downstream side wall of the centre block and the second side member, the part of the guide channel between the downstream side wall of the centre block and the second side member constituting the exhaust channel.

BRIEF DESCRIPTION OF THE DRAWINGS

The invention is illustrated but not limited by the following description with reference to the accompanying drawings in which.

DETAILED DESCRIPTION OF A PREFERRED EMBODIMENT

Figure 1:
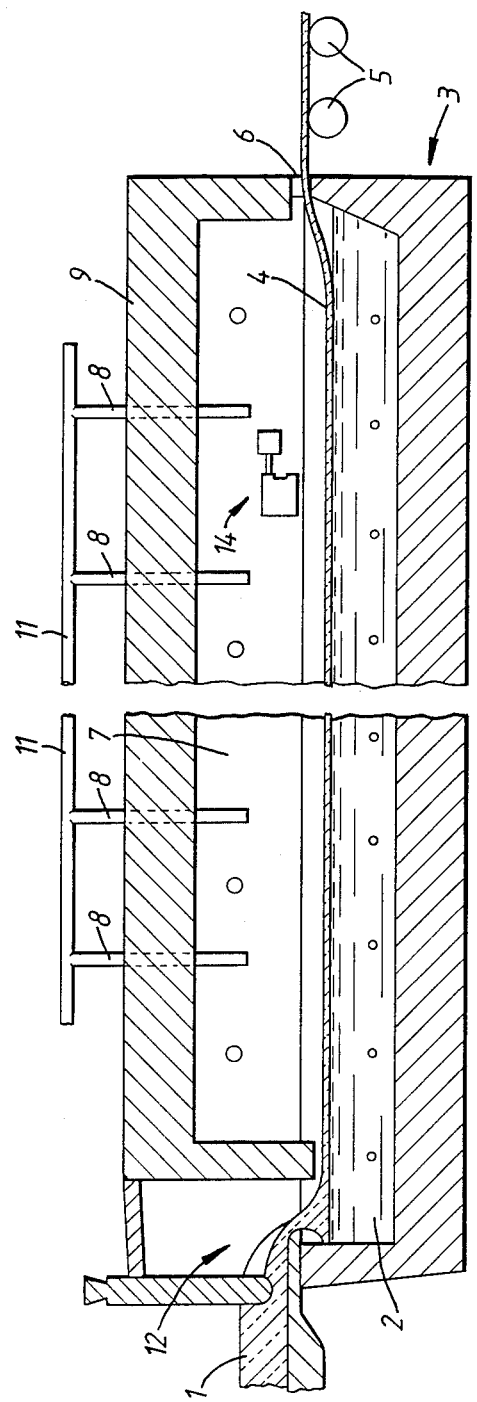
FIG. 1 is a vertical section through a float glass manufacturing apparatus showing, in outline (and not to scale), the position of a coating apparatus for operation of the invention extending transversely of the path of travel of a ribbon of glass.

FIG. 1 illustrates molten glass 1 being delivered onto a bath of molten tin or tin alloy 2 contained in a tank structure 3. A ribbon of glass 4, narrower than the bath of the molten metal, is formed on the bath where it is supported by the molten tin. The ribbon is advanced along the bath and withdrawn from the bath over driven traction rollers 5 mounted beyond the outlet 6 of the bath. A protective atmosphere, for example 95% nitrogen and 5% hydrogen, is maintained at a plenum in the headspace 7 over the molten metal bath, being supplied through ducts 8 extending downwardly through the roof 9 and connected to a common header 11. A temperature gradient is maintained down the bath from a temperature of about 1000° C. at the inlet end 12 of the bath to a temperature in the range from 570° C. to 650° C. at the outlet 6 where the ribbon is discharged from the bath.

A gas distributor, generally designated 14, for supplying coating gas to the surface of the glass ribbon is located transversely of the path of travel of the ribbon towards the outlet end of the bath. The distributor thus extends across the upper surface of the ribbon of glass and transversely of the path of travel of the glass.

Figure 2:
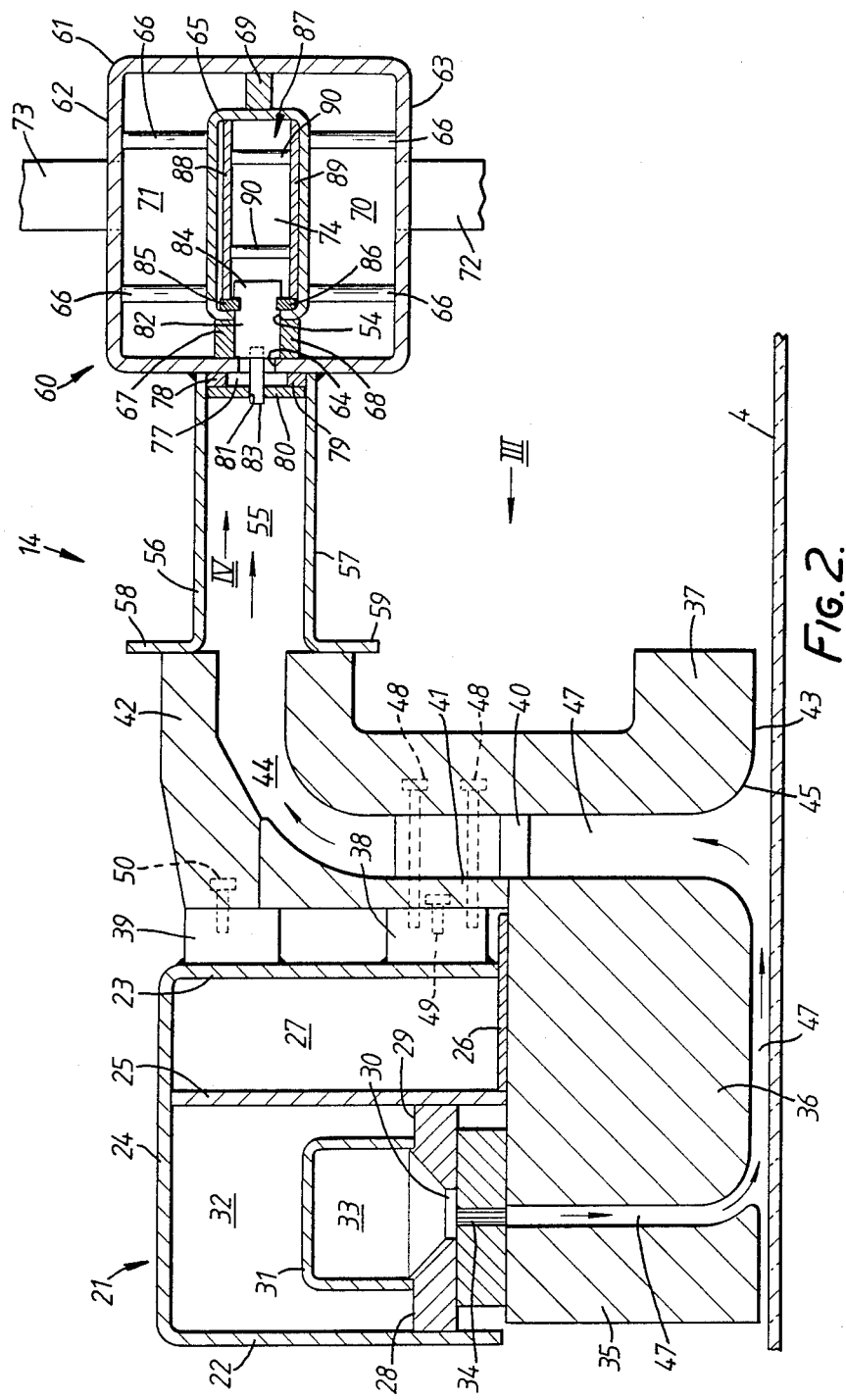
FIG. 2 is an enlarged vertical section through the coating apparatus shown in FIG. 1.

As illustrated in FIG. 2, the gas distributor 14 comprises an inverted U-section channel member 21 having side walls 22,23 and a top wall 24. The channel within member 21 is divided by a vertical partition 25 welded to the top wall 24 of member 21. A horizontal member 26 is welded to the base of side wall 23 and extends inwardly and outwardly therefrom; the inwardly extending section of member 26 forms, with partition 25, side wall 23 and upper wall 24, a rectangular duct 27. Horizontal members 28,29 extend inwardly from side wall 22 and vertical partition 25 respectively and define between them an elongated aperture 30. A second smaller inverted U-section channel member 31 is centrally located between side wall 22 and partition 25, with its lower edges welded to horizontal members 28,29.

The two inverted U-section channel members 21,31 define between them, together with horizontal members 28 and 29, a U-section duct 32 for the passage of a cooling liquid, and rectangular duct 27 serves as a return duct for the cooling liquid. The interior face of U-section channel member 31, together with the bevelled ends of horizontal members 28,29 defines a coating gas supply duct 33 which opens through elongated aperture 30 into a gas flow restrictor 34.

The gas flow restrictor 34 is of the kind described in U.S. Pat. 4 019 887. It comprises a plurality of metal strips longitudinally crimped in the form of a sine wave and vertically mounted in abutting relationship with one another extending along the length of the distributor (that is across the width of the path of the glass to be coated). Adjacent crimped metal strips are arranged "out of phase" with each other to define a plurality of vertical channels between them. These vertical channels are of small cross-sectional area relative to the cross-sectional area of the gas supply duct 33, so that when coating gas is supplied under pressure to the duct 33, the pressure drop along the duct 33 is small compared to the pressure drop through the vertical channels, and the gas flow restrictor 34 provides release of coating gas from the gas supply duct 33 at substantially uniform pressure along the length of the duct.

Figure 3:
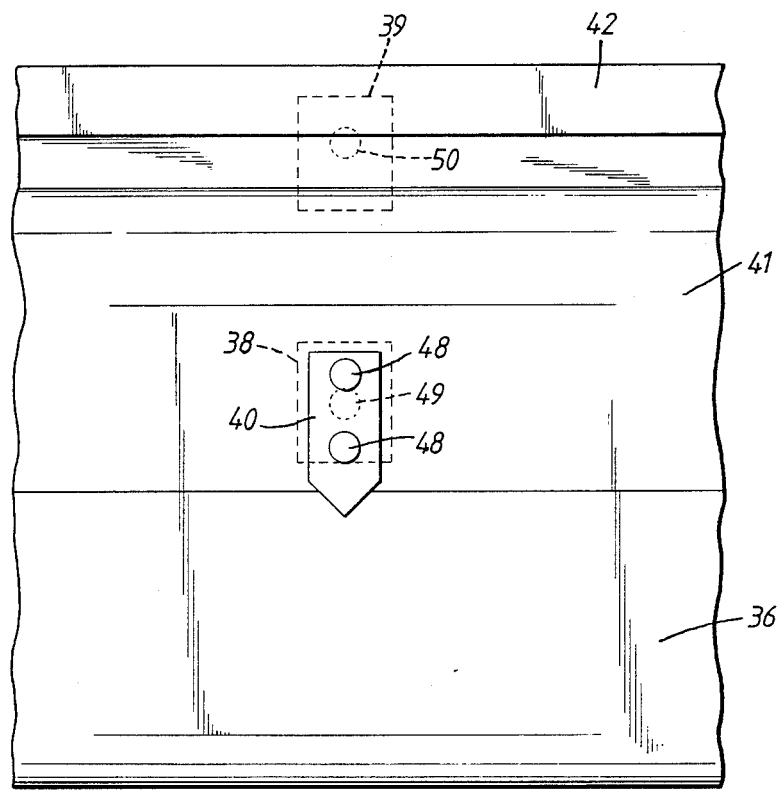
FIG. 3 is an elevation of part of the coating apparatus of FIGS. 1 and 2 in the direction of arrow III in FIG. 2 with the graphite block 37 and extractor 60 removed.

Upstream, centre and downstream, shaped graphite blocks 35,36 and 37 respectively extend across the width of the glass to be coated. Upstream graphite block 35 is secured by bolts (not shown) to horizontal member 28, while the centre graphite block 36 is secured by bolts (not shown) to horizontal members 26 and 29. Downstream graphite block 37 is similarly secured by bolts 48 passing through distance pieces 40 (FIGS. 2,3) spaced across the width of the distributor to spaced steel blocks 38 welded to the outer face of side member 23 of the U-section channel member 21. An upper series of spaced steel blocks 39 is welded to the outer face of side member 23 of U-section channel member 21 above the lower steel blocks 38. A fourth shaped graphite block 41 stands on the back upper edge of centre block 36 and is secured by bolts 49 to the lower steel blocks 38. A fifth shaped graphite block 42 stands on the top of block 41 and is secured by bolts 50 to the upper steel blocks 39. The graphite blocks 41 and 42 extend across the width of the glass to be coated.

The graphite blocks 35 and 37 constitute first and second side members which together with the centre block define a substantially U-shaped guide channel 47 for coating gas flowing from the gas supply duct 33 through the gas flow restrictor 34, between the graphite block 35 and the upstream side wall of the centre block, between the bottom wall of the centre block and the path of the glass, and between the downstream side wall of the centre block and the graphite block 37. The graphite block 37 has a surface 43 opposed to and adjacent the glass surface on which a deposit from said used coating gas would tend to form, in the absence of the inert gas flow provided by the present invention. The block 37 has a convex curved transition surface 45 which is continuous with surface 43 and defines the lower part of the downstream wall of the exhaust channel.

The shaped graphite blocks 41 and 42 define, with the downstream block 37, a continuation 44 of the exhaust channel which connects the exhaust channel to an extractor 60. An extractor generally designated 60 is mounted downstream of the gas distributor to extract gas from the exhaust channel.

The extractor 60 (see FIGS. 2 and 4) comprises a square hollow section steel member 61 closed at its ends 62,63 with a slot 64 cut in its front face and terminating short of the ends. Horizontal guide members 56,57 with vertical flanges 58,59 abutting the vertical faces of carbon blocks 42,37 are welded on to the front face of member 61 above and below the slot to provide a gas flow path 55 forming a further continuation of the exhaust channel to the slot 64 in member 61.

A rectangular hollow section member 65 (FIG. 2) with a slot 54 cut in its front face and terminating level with ends of slot 64 is mounted centrally in member 61 by means of steel rods 66. Horizontal plates 67 and 68 above and below the slots 64,54 are welded to the inner front face of member 61 and the outer front face of member 65. A horizontal plate 69 is welded to the outer rear face of member 65 and the inner rear face of member 61. The rectangular hollow section member 65 together with plates 68,69 defines the upper side of a lower channel 70 for cooling water flow through the member 61. The member 65 with plates 67,69 defines the lower side of an upper channel 71 for the return flow of cooling water. Inlet and outlet ducts 72,73 open into channels 70,71 respectively. Rectangular hollow section member 65 constitutes a water-cooled gas extraction duct 74 across the width of the coating apparatus and is connected by exhaust ducts 75,76 (FIG. 4) to a low pressure vacuum pump.

Figure 4:
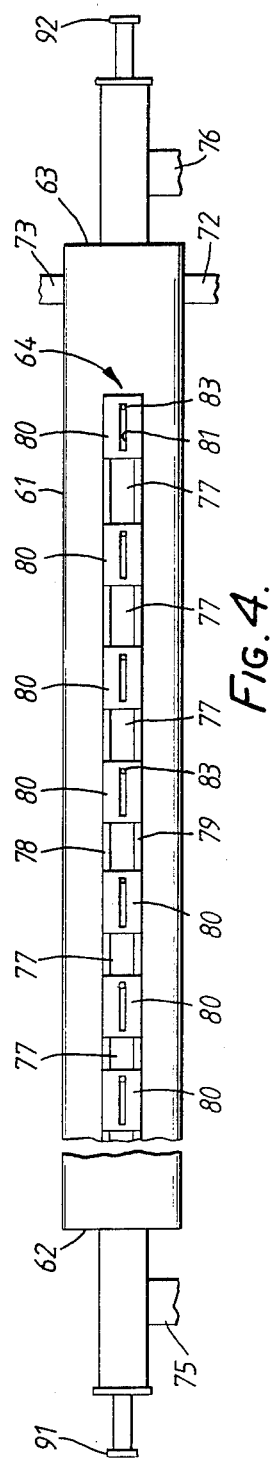
FIG. 4 is a front elevation of extraction 60 in the direction of arrow IV in FIG. 2 with the horizontal guide members 56,57 of the extractor 60 removed.

As shown in FIG. 4, the slot 64 in member 61 is blanked off by spaced plates 77 over the front of the channel. The blanking plates 77 are of reduced length towards the centre of the slot in order to ensure, so far as possible, a uniform suction effect along the length of the extractor when suction is applied through exhaust ducts 75,76. Horizontal steel strips 78,79 are welded to the front face of member 61 above and below the blanking plates 77 and carry slotted plates 80 with slots 81 (not all numbered) over the openings between blanking plates 77 in slot 64. The slots 81 provide a gas flow path from the exhaust channel between the carbon blocks and horizontal guide members 56,57 through slot 64, into the channel 82 defined between horizontal plates 67,68 within member 61 and thence into extraction duct 74 in rectangular hollow section member 65.

Figure 5:
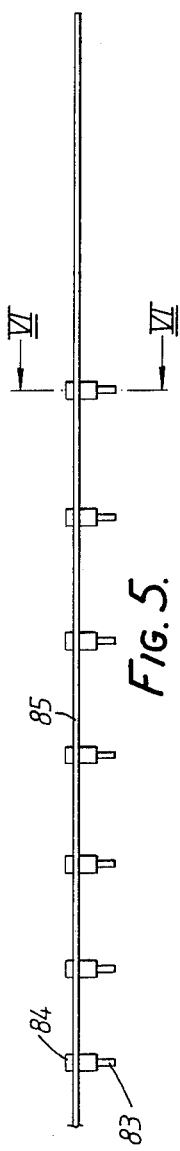
FIG. 5 is a plan view of a blockage clearing device incorporated in extractor 60.
Figure 6:
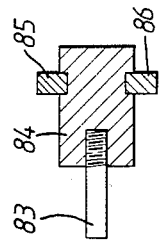
FIG. 6 is a section on the line VI—VI in FIG. 5.

In use the slots 81 in slotted plates 80 tend to become partially blocked with solid deposited from the used coating gas. To clear such deposits, the slots are provided with pins 83 which are mounted for reciprocation in the slots. Each of the pins 83 is mounted in a block 84 (see FIGS. 2, 5 and 6) and extends through the corresponding slot 81. The blocks 84 are joined by upper and lower horizontal steel strips 85,86 embedded in slots in the blocks 84. The strips 85,86 are located between the inner front face of rectangular section 65 (see FIG. 2) and a support structure 87 comprising upper and lower horizontal plates 88,89 spaced by vertical rods 90 within the rectangular section 65. Horizontal members 85,86 are connected to handles 91,92 extending beyond the ends of section 65 (FIG. 4). Reciprocation of the strips 85, 86 within member 65 by means of handles 91,92 moves the pins 83 to and fro within the slots 81 in plates 83 removing any deposits from the sides of the slots and preventing any blockage that might otherwise occur. The extractor 60 connected to the low pressure vacuum pump (not shown) constitutes suction means for withdrawing gas along the exhaust channel.

Each of the graphite blocks 35 and 37, like the centre block 36, is spaced from the path of travel of a glass ribbon over the float bath. The optimum gap between surface 43 of the bottom of the block 37 and the path of travel of the glass surface will vary with the coating gas used and the coating conditions, but will usually be at least 5 mm to allow a flow of bath atmosphere to be drawn between surface 43 and the glass surface. In the apparatus shown in FIG. 2, the second side member constituted by graphite block 37 terminates short of the path of travel of the surface of the glass by a distance which is about equal to the height of U-shaped guide channel between the bottom wall of the centre block and the path of travel of the surface of the glass.

In use, the rate of supply of coating gas is adjusted to provide laminar flow of the coating gas parallel to the glass surface under the centre block 36. At the same time, the height of the block 37 is selected, together with the suction applied by the extractor 60 to the exhaust channel, to withdraw a stream of bath atmosphere through the gap defined between the lower surface 43 of block 37 and the glass ribbon 4. The curvature of transition surface 45, which is continuous with surface 43 of block 37, is similar but opposite to the curvature of the downstream wall of the centre block 36, and provides a smooth flow of bath atmosphere thereover without mixing of the used coating gas and the bath atmosphere; it also avoids the flow of the bath atmosphere disrupting the laminar flow of coating gas parallel to the glass surface under the centre block 36.

The slots 81 for exhaust of the used coating gas in extractor 60 are spaced so as to ensure that substantially uniform suction is applied to the exhaust channel across the width of the glass ribbon being coated, so maintaining uniform coating across the width of the glass. When necessary, handles 91 and 92 are reciprocated to move pins 83 to and fro in slots 81 and prevent deposits from the coating gas building up and blocking the slots.

The invention permits the coating process to be used for extended periods without the need for continued interruptions to clean deposits off the surface of the diverting means which directs the used coating gas away from the glass surface. For example, the apparatus described was used to coat 6 mm float glass with a reflecting silicon coating for a continuous period of 17 hours without any need to stop the process to remove deposits of silicon from the apparatus.

Although the invention has been described, by way of example, with reference to a process in which the coating gas is caused to flow parallel to the glass to be coated under laminar flow conditions, it will be appreciated that it can also be used with other glass coating processes in which used coating gas is directed away from the glass surface at the end of a coating zone. The expression "used coating gas" is used herein to refer to a gas which has been used to coat the glass. It does not imply that all the reactive components in the gas have necessarily been used and, indeed, the used coating gas removed through the exhaust channel may contain significant amounts of unreacted coating components.

I claim:

1. A method of coating flat glass by chemical vapor deposition at a coating station comprising passing a coating gas over a hot glass surface in a coating zone, directing used gas away from the glass to an exhaust channel at a downstream end of the coating zone by diverting means disposed above the glass surface to form a gap therebetween, the gap defined by a portion of a surface means of the diverting means which extends along the gap and into the exhaust channel, and inducing a flow of inert gas inwardly through the gap to the exhaust channel to inhibit the formation of a deposit from the coating gas onto the gap-forming portion of the surface means, whereby the inert gas travels smoothly along the surface means from within the gap to within the exhaust channel to inhibit disruption of the flow of coating gas.

2. A method according to claim 1, wherein the inert gas traveling smoothly from the gap to the exhaust channel travels along a smoothly curved transition surface portion of the surface means.

3. A method according to claim 2, wherein the surface means includes a second surface portion defining a downstream wall of the exhaust channel, the transition surface portion interconnecting the first and second surface portions.

4. A method according to claim 1, wherein the flow of inert gas is induced by applying a suction to the exhaust channel.

5. A method according to claim 1, wherein the inert gas is drawn from an atmosphere disposed externally of the coating station.

6. A method according to claim 5, wherein the coating is applied to a ribbon of float glass as it is advanced over a float bath and the stream of inert gas is composed of a protective atmosphere of the float bath.

7. A method according to claim 1, wherein the coating gas comprises a silane.

8. A method of coating flat glass by chemical vapor deposition at a coating station comprising passing a substantially laminar flow of coating gas over a hot glass surface in a coating zone, directing used gas away from the glass to an exhaust channel at a downstream end of the coating zone be diverting means, the diverting means including a first surface portion disposed opposite and adjacent the glass surface to form a gap therebetween, and applying a suction to the exhaust channel to induce a flow of inert gas inwardly through the gap to the exhaust channel to inhibit the formation of a deposit from the coating gas onto the first surface portion, wherein the flow of inert gas from the gap to the exhaust channel travels smoothly along a smoothly curved transition surface portion of the diverting means adjacent the downstream end of the coating zone to inhibit disruption of the laminar flow of coating gas.

9. Apparatus for coating flat glass by deposition of a coating from a coating gas, comprising a support for glass to be coated, means for advancing the glass over the support, a gas supply duct extending transversely of the path of travel of the glass and arranged to direct a coating gas onto a hot surface of the glass in a coating zone extending above the hot glass surface, an exhaust channel disposed adjacent a downstream end of the coating zone for conducting used coating gas from the coating zone, diverting means disposed adjacent the downstream end of the coating zone for diverting used gas into the exhaust channel, said diverting means disposed above the hot glass surface to from a gap therebetween, said gap defined by a portion of a surface means of the diverting means which extends along the gap and into the exhaust channel, and means for inducing a flow of inert gas inwardly through the gap to the exhaust channel to inhibit the formation of a deposit from the coating gas onto the gap-forming portion of the surface means, said surface means being configured to smoothly conduct the flow of inert gas from within the gap to within the exhaust channel to inhibit disruption of the flow of coating gas.

10. Apparatus according to claim 9, wherein said surface means includes a smoothly curved transition surface portion extending adjacent a downstream end of the coating zone.

11. Apparatus according to claim 10, wherein the surface means includes a second surface portion defining a downstream wall of the exhaust channel, the transition surface portion interconnecting the first and second surface portions.

12. Apparatus according to claim 9 including suction means connected to said exhaust channel for inducing the flow of inert gas through the gap.

13. Apparatus according to claim 9, wherein the gap-forming surface portion is disposed parallel to the path of travel of the surface of the glass and is spaced at least 5 mm therefrom.

14. Apparatus for coating flat glass by deposition of a coating from a coating gas, comprising a support for glass to be coated, means for advancing the glass over the support, a gas supply duct extending transversely of the path of travel of the glass and arranged to direct a laminar flow of coating gas along a hot surface of the glass in a coating zone extending above the hot glass surface, an exhaust channel disposed adjacent a downstream end of the coating zone for conducting used coating gas from the coating zone, diverting means disposed adjacent the downstream end of the coating zone for diverting used coating gas into the exhaust channel, the diverting means including a first surface portion disposed opposite and adjacent the glass surface to form a gap therebetween and a transition surface portion extending from said first surface portion and into said exhaust channel, and suction means connected to said exhaust channel for inducing a flow of inert gas inwardly through the gap to the exhaust channel to inhibit the formation of a deposit from the coating gas onto the first surface portion, said transition surface portion being smoothly curved such that the inert gas flowing from the gap to the exhaust channel travels smoothly therealong adjacent the downstream end of the coating zone to inhibit disruption of the laminar flow of coating gas.

15. Apparatus according to claim 14, wherein the gas supply duct includes a center block, first and second side members disposed upstream and downstream of the center block and defining therewith a substantially U-shaped guide channel for the coating gas, the second side member defining the diverting means, a first upright leg of the U-shaped guide channel formed by opposing upright walls of the first side member and the center block, a second upright leg of the guide channel defining the exhaust channel and formed by an upright wall of the center block and the surface means of the diverting means, a horizontal leg of the guide channel defined by a bottom wall of the center block.

16. Apparatus according to claim 15, wherein said gap has a height about equal to the distance from the glass surface to the bottom wall of the center block.

17. Apparatus according to claim 16, wherein the height of the gap is at least 5 mm.

* * * * *